United States Patent [19]

Fukazawa et al.

[11] Patent Number: 4,791,488
[45] Date of Patent: Dec. 13, 1988

[54] LINE-LOCKED CLOCK SIGNAL GENERATION SYSTEM

[75] Inventors: Kazuo Fukazawa, Tokyo; Toshio Kaneuchi, Saitama, both of Japan

[73] Assignee: RCA Licensing Corporation, Princeton, N.J.

[21] Appl. No.: 84,346

[22] Filed: Aug. 12, 1987

[51] Int. Cl.$^4$ ............................................. H04N 5/04
[52] U.S. Cl. .................... 358/149; 358/148; 358/158; 375/118; 375/119; 375/120; 328/55; 328/56; 328/133; 307/510; 307/511
[58] Field of Search ............... 358/148, 149, 150, 151, 358/152, 153, 154, 158, 159; 328/55, 56, 63, 72, 109, 110, 133, 201; 307/262, 510, 511, 595; 375/118, 119, 120

[56] References Cited

U.S. PATENT DOCUMENTS

| | | | |
|---|---|---|---|
| 3,911,368 | 10/1975 | Tarczy-Hornoch | 328/208 |
| 4,403,244 | 9/1983 | Fujishima | 358/19 |
| 4,476,490 | 10/1984 | Kaneko | 358/148 |
| 4,489,342 | 12/1984 | Gollinger et al. | 358/17 |
| 4,600,895 | 7/1986 | Landsman | 331/1 A |
| 4,617,679 | 10/1986 | Brooks | 375/119 |
| 4,635,097 | 1/1987 | Tatami | 358/13 |
| 4,637,018 | 1/1987 | Flora et al. | 328/55 |
| 4,677,648 | 6/1987 | Zurfluh | 375/120 |
| 4,713,690 | 12/1987 | Watanabe et al. | 358/148 |
| 4,729,024 | 3/1988 | Kawai et al. | 358/158 |

OTHER PUBLICATIONS

ITT Intermetall Semiconductors; "Digit 2000 VLSI Digital TV System"; pp. 113–115.

Primary Examiner—James J. Groody
Assistant Examiner—Michael D. Parker
Attorney, Agent, or Firm—Paul J. Rasmussen; Eric P. Herrmann; Kenneth N. Nigon

[57] ABSTRACT

A television receiver includes a phase-locked loop (PLL) which generates a clock signal having a frequency of N times the line frequency and being phase-locked to the horizontal line synchronizing signal. The clock signal produced by this PLL has a frequency which tends to jitter between N+1 and N−1 times the line frequency. To compensate for this jittering in the frequency of the clock signal, phase alignment circuitry is coupled to the PLL to align the phase of the clock signal to the horizontal drive signal produced by the PLL on the occurrence of each horizontal drive pulse. The PLL also includes a delay element which delays the horizontal drive signal applied to the phase comparator of the PLL. This delay element effectively advances the phase of the horizontal drive signal and the line-locked clock signal with respect to the horizontal sync signal to compensate for signal processing delays imparted in the generation of the horizontal drive signal and the clock signal.

7 Claims, 4 Drawing Sheets

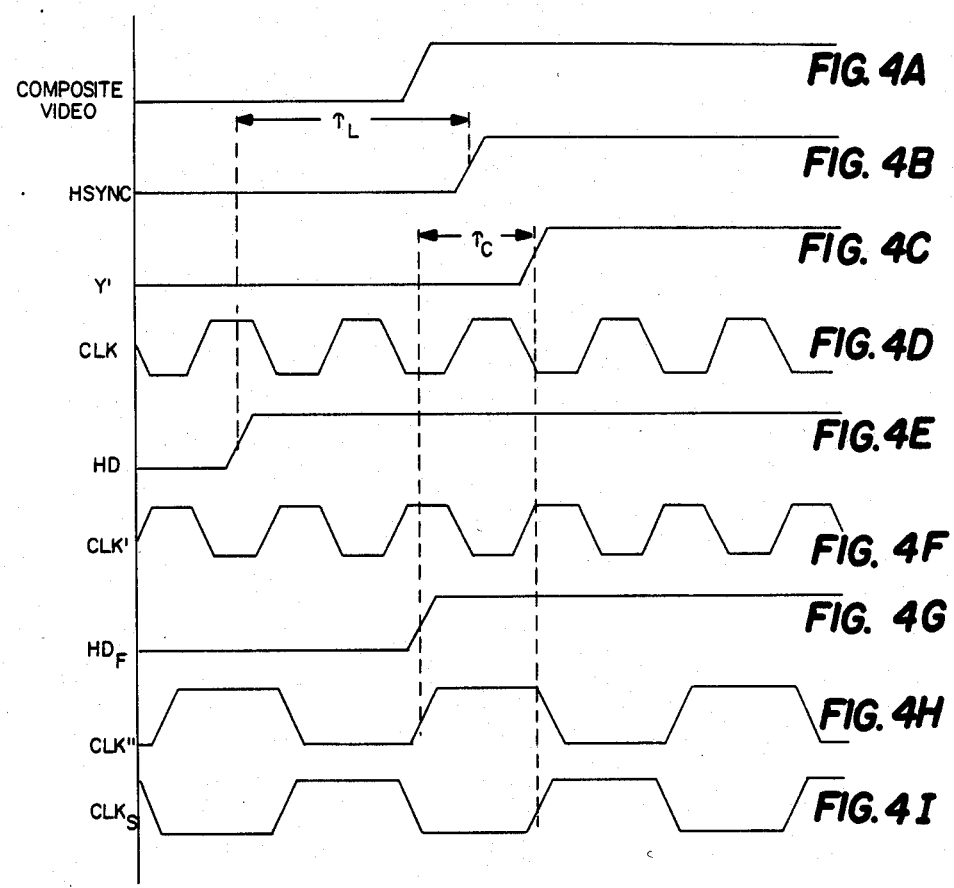

LINE-LOCKED CLOCK SIGNAL GENERATION SYSTEM

The present invention relates to circuitry for producing a substantially jitter-free line-locked clock signal.

In video signal processing systems which include field or frame memories, for example, a frame comb filter, it may be desirable to use a sampling clock signal that is locked in phase to the horizontal line synchronizing signal component of the processed video signals. When a line-locked sampling clock signal is used, the number of samples in each line interval and, thus, the number of samples in each field interval remains substantially constant from field to field. This consistency is desirable to ensure that corresponding samples from successive fields or frames of the video signal are properly aligned for processing.

A typical line-locked clock signal generator is described in U.S. Pat. No. 4,476,490 entitled "Horizontal Scanning Frequency Multiplying Circuit", which is hereby incorporated by reference. Thin clock signal generator includes a phase-locked loop (PLL) which produces a signal having a frequency of $Nf_H$, N times the horizontal line scanning frequency, $f_H$. The PLL used in the referenced patent is shown in FIG. 1, labelled "prior art". In this system, a horizontal synchronizing signal, HORIZ SYNC, separated from the input composite video signal, is applied to one input terminal of a phase comparator 14. Another input terminal of the phase comparator 14 is coupled to receive a signal, provided by a frequency divider 17, which has substantially the same frequency as the signal HORIZ SYNC. The phase comparator 14 produces an output signal which is proportional to the difference in phase between the signals applied to its input ports. The signal provided by the phase comparator 14 is applied to a low-pass filter 15, the loop filter of the PLL. The filter 15 includes circuitry for integrating the phase difference signal to develop a signal which is proportional to the difference in frequency between the signal HORIZ SYNC and the signal provided by the divider 17. This frequency difference signal is applied to the control input terminal of a voltage controlled oscillator (VCO) 16. The VCO 16, which has a free running frequency substantially equal to $Nf_H$, produces the output clock signal CK. This clock signal is applied to the input terminal of the frequency divider 17 to complete the loop. The signal CK produced by the VCO exhibits changes in frequency which track changes in the frequency of the horizontal line synchronizing signal, HORIZ SYNC.

Although the clock signal, CK, produced by the PLL system shown in FIG. 1, is locked in phase to the horizontal line synchronizing signal, the frequency of the signal CK may not be an exact integer multiple of the frequency of the signal HORIZ SYNC. Assuming that the frequency, $F_H$, of the signal HORIZ SYNC remains constant, the clock signal, CK, may vary in frequency between slightly more than $(N-1)f_H$ and slightly less than $(N+1)f_H$ without producing a change in the phase of the signal provided by the frequency divider 17. If the frequency of the signal CK is less than or equal to $(N-1)f_H$ or greater than or equal to $(N+1)f_H$, the phase of the signal provided by the circuitry 17 will change and the error in the frequency of the signal CK will be corrected.

The range of frequencies between $(N-1)f_H$ and $(N+1)f_H$ defines the amount of "jitter" which will be tolerated by the PLL. For example, in an NTSC television receiver which uses a nominal sampling frequency of 910 $f_H$ (14.318 MHz), the clock signal may vary between 909 $f_H$ (14.302 MHz) and 911 $f_H$ (14.334 MHz) and still be locked in phase to the horizontal line synchronizing signal. While this amount of jitter may not change the number of samples produced from each horizontal line, it is significant as it relates to the timing of the first sample on a line relative to the horizontal synchronization pulse for that line. In the NTSC television receiver described above, due to the jitter in the clock signal, the first sample on a given line may be taken at any time within 70 ns after the positive-going transition of the horizontal synchronization pulse. This variation in the timing of the initial sample on a line also applies to subsequent samples on the line and may, therefore, distort the reproduced image. This timing variation would cause vertical or diagonal lines in the image to appear wavy or jagged.

It would be advantageous if the circuitry which generated the sampling clock signal also included circuitry for eliminating the jitter from the clock signal.

SUMMARY OF THE INVENTION

The present invention is embodied in circuitry for generating a line-locked clock signal which is compensated for variations in the frequency of the clock signal. The circuitry includes a phase locked loop which produces a horizontal drive signal and a clock signal. Both the horizontal drive signal and the clock signal are locked in phase to the horizontal line synchronizing signal component of an input composite video signal. The clock signal has a nominal frequency of N times the frequency of the horizontal line synchronizing signal. The phase-locked clock signal is applied to signal phase alignment circuitry which is also coupled to receive the horizontal drive signal. The phase alignment circuitry includes circuitry developing a plurality of clock phase signals and circuitry for selecting from among the clock phase signals one which is closest to having a predetermined phase relationship with the horizontal drive signal.

A further embodiment of the invention includes a delay element in the phase locked loop which causes the clock signal and the horizontal drive signal to be advanced in phase with respect to the input horizontal line synchronizing signal.

BRIEF DESCRIPTION OF THE DRAWING

FIGS. 4A through 4I are timing diagrams useful for explaining the operation of the circuitry shown in FIGS. 2 and 3.

DETAILED DESCRIPTION

Figure 1:
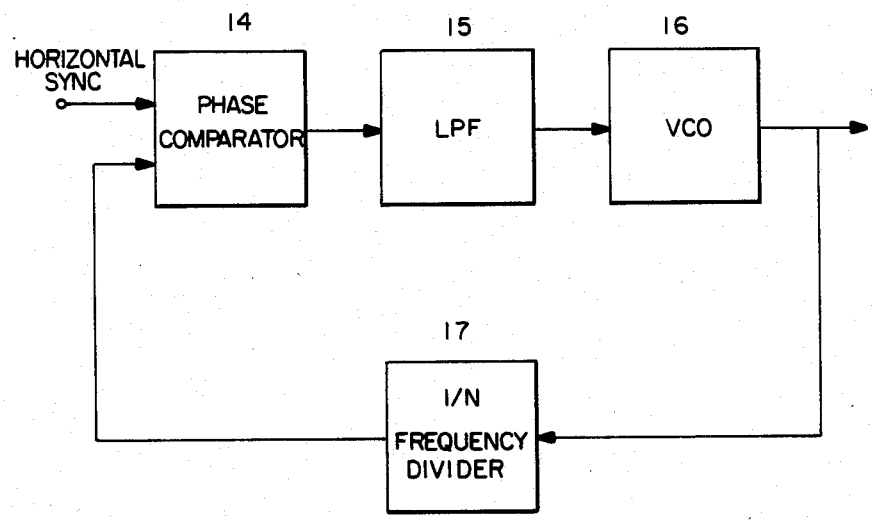
FIG. 1 (prior art) is a block diagram of a conventional line locked clock generator.

In the drawings, broad arrows represent busses for conveying multiple-bit parallel digital signals and line arrows represent connections for conveying analog signals or single-bit digital signals. Depending on the processing speed of the devices, compensating delays may be required in certain of the signal paths. One skilled in the art of analog and digital signal processing circuit design would know where such delays would be needed in a particular system.

Figure 2:
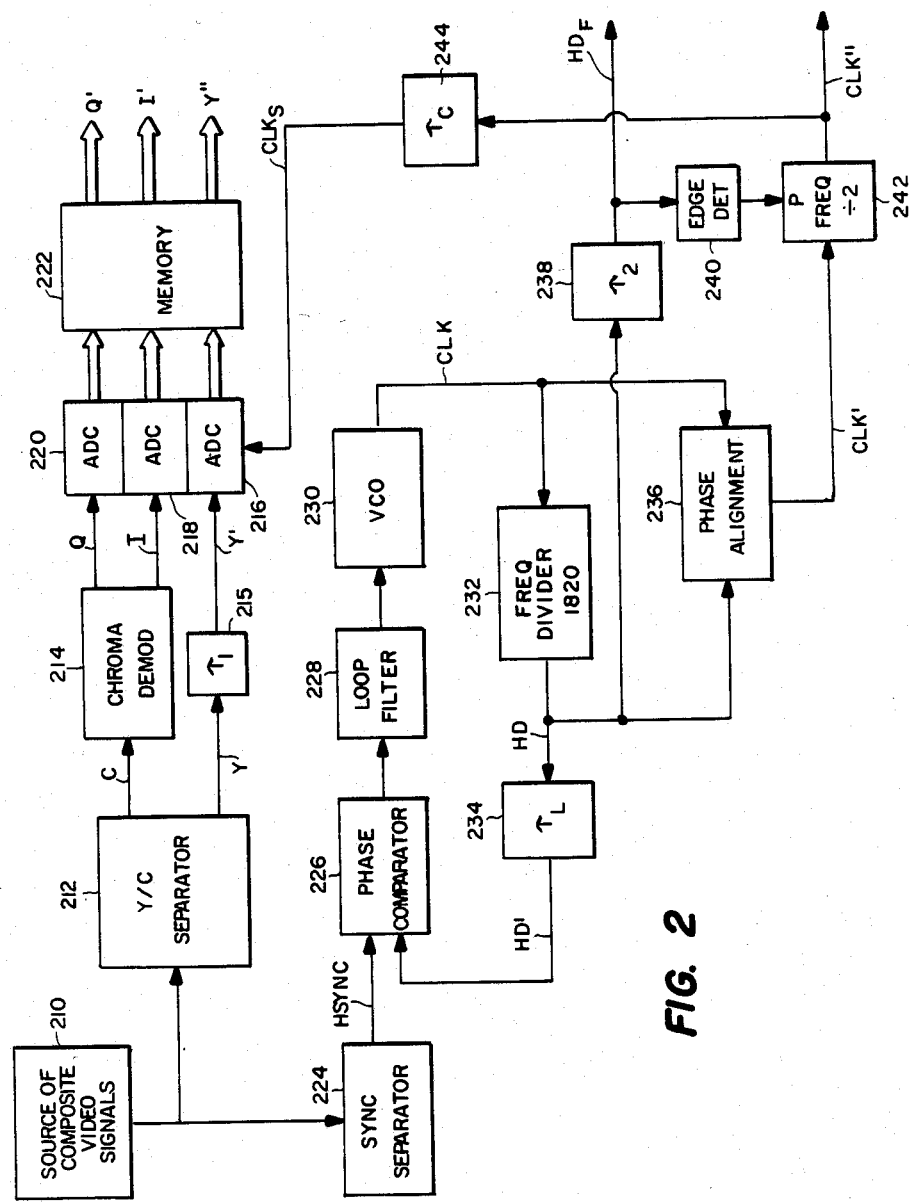
FIG. 2 is a block diagram of a portion of a television signal processing circuit which includes an embodiment of the present invention.

FIG. 2 is a block diagram showing a portion of a partly analog, partly digital television receiver which incorporates the present invention. In FIG. 2, a source of composite video signals 210, which includes the tuner, IF amplifier and video detector of a conventional television receiver, provides NTSC composite video signals to luminance/chrominance separation circuitry 212. The circuitry 212 used with this embodiment of the invention includes a low-pass filter (not shown) and a band-pass filter (not shown) for separating the respective luminance signal component, Y, and chrominance-band signal component, C, from the composite video signals. The separated chrominance-band signal, C, is applied to chrominance signal demodulation circuitry 214. The circuitry 214, which, in the present embodiment of the invention includes two synchronous demodulators (not shown), demodulates the signal C to provide two color difference signals, for example, I and Q. The luminance signal, Y, is applied to a compensating delay element 215 which compensates for the processing delay through the chrominance signal demodulation circuitry 214 to provide a luminance signal Y' that is aligned with the I and Q color difference signals produced by the circuitry 214. The luminance signal Y' and the color difference signals I and Q are applied to respective analog-to-digital converters (ADC's) 216, 218 and 220. The ADC's 216, 218 and 220 sample the respective signals Y, I and Q at instants determined by a sampling clock signal $CLK_S$. The digital samples provided by the ADC's 216, 218 and 220 are applied to a field memory 222 which, in turn, provides the delayed samples Y", I' and Q', for application to other video signal processing circuitry (not shown). The circuitry which uses the field memory 222 may include, for example, a recursive noise reduction system or a freeze field processor.

The sampling clock signal, $CLK_KS$, applied to the ADC's 216, 218 and 220 is a line-locked clock signal, that is, a clock signal which is locked in phase to the horizontal line synchronizing signal component of the composite video signals provided by the source 210. This clock signal is developed by the circuitry described below.

The composite video signals provided by the source 210 are applied to conventional synchronizing signal separation circuitry 224. The circuitry 224 separates the horizontal line synchronizing signal component from the composite video signals and provides this separated signal as the signal HSYNC to one input terminal of a phase comparator 226. Another input terminal of the phase comparator 226 is coupled to receive a signal HD', having the same nominal frequency as the signal HSYNC. The phase comparator 226, which is of conventional design, generates a signal which is proportional to the instantaneous difference in phase between the signals HD' and HSYNC. This phase difference signal is applied to a loop filter 228, which integrates the signal over time to develop a signal representing the difference in frequency between the signals HD' and HSYNC. The frequency difference signal provided by the loop filter 228 is applied to the control input terminal of a conventional voltage controlled oscillator (VCO) 230. The VCO 230, used in this embodiment of the invention, has a free-running frequency of 28.64 MHz which is approximately equal to $8f_c$, eight times the frequency, $f_c$, of the color subcarrier signal component of the composite video signal provided by soure 210. The signal, CLK, provided by the VCO 230 is applied to frequency dividing circuitry 232. The circuitry 232 which, in the present embodiment of the invention includes an 11-bit counter, divides the signal CLK, in frequency, by a factor of 1820 to produce a signal HD, having the same nominal frequency as the horizontal line synchronizing signal HSYNC. The signal HD is applied to a delay element 234 which delays the signal HD by a predetermined amount of time, to generate the signal HD' which is applied to the phase comparator 226.

As set forth above, the phase comparator 226 and loop filter 228 adjust the frequency and phase of the VCO 230 so that the signal HD' is aligned in frequency and phase with the signal HSYNC. However, since the signal HD' is delayed in time, via the delay element 234, with respect to the signal HD, the signal HD leads the signal HSYNC in phase. In other words, the pulses of the signal HD occur prior to corresponding pulses of the signal HSYNC by the amount of time that signals are delayed by the delay element 234. If, for example, the delay element 234 delays the signal HD by an amount of time substantially equal to the processing delay through the sync separator circuitry 224, then the signal HD would be aligned with the horizontal line synchronizing signal component of the composite video signal provided by the source 210. As set forth below, in the present embodiment of the invention the amount of time delay provided by the delay element 234 is selected so that a final horizontal drive signal $HD_F$ and the clock signal $CLK_S$ have a predetermined phase relationship with the horizontal line synchronizing signal components of the luminance signal Y and color difference signals I and Q applied to the respective ADC's 216, 218 and 220.

The phase-advanced horizontal drive signal HD and the clock signal CLK are applied to respectively different input terminals of phase alignment circuitry 236. The phase alignment circuitry used in this embodiment of the invention is shown in FIG. 3.

Figure 3:
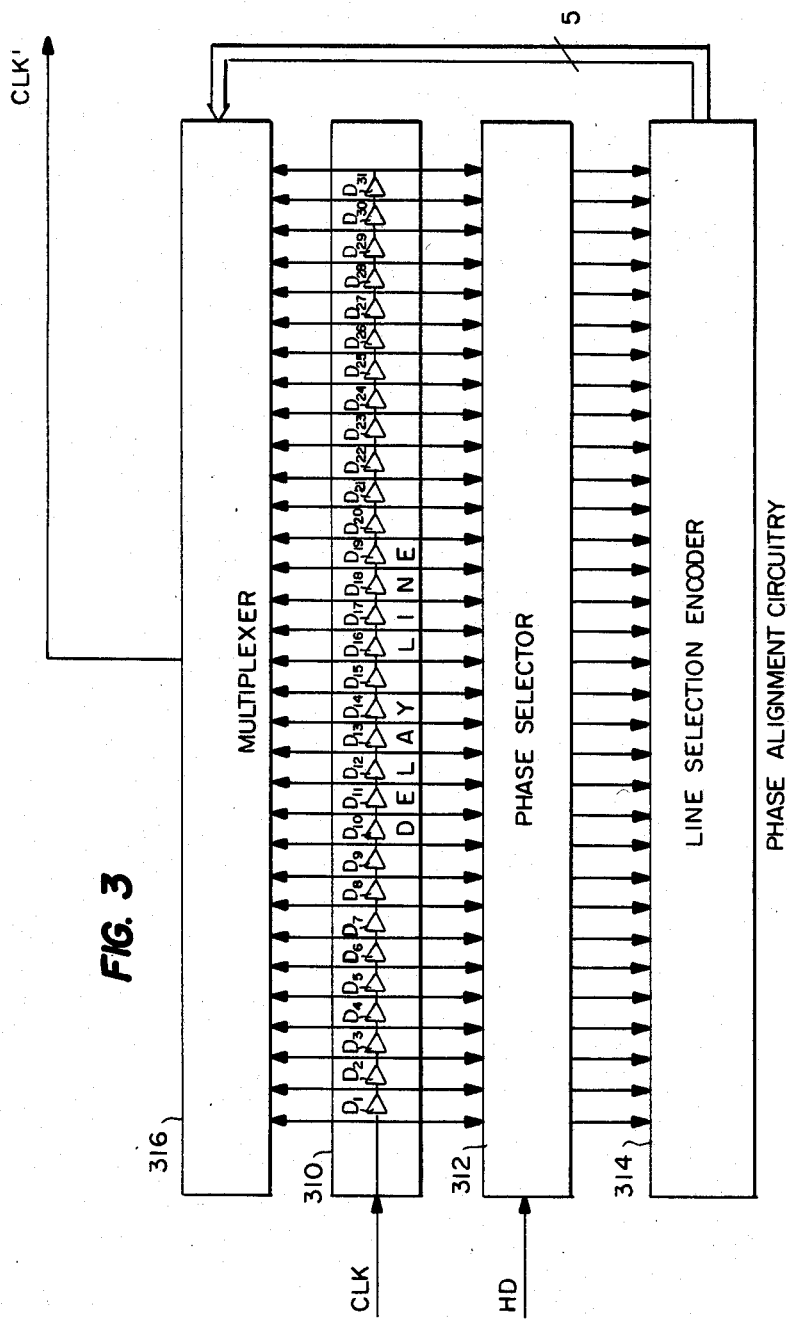
FIG. 3 is a block diagram of phase alignment circuitry suitable for use in the signal processing circuitry shown in FIG. 2.

In FIG. 3, the 28.64 MHz clock signal, CLK, is applied to the input terminal of a delay line 310. The delay line 310 used in the present embodiment of the invention is a chain of 31 serially connected buffer circuits, $D_1$ through $D_{31}$. Each of the buffer circuits used in the delay line 310 provides a time delay substantially equal to 1/32 times the period of the signal CLK. The delay line 310 has 32 output terminals, one connected to the input terminal of the first buffer circuit in the chain, $D_1$, and one connected to the output terminal of each of the buffer circuits $D_1$ through $D_{31}$. The 32 output terminals of the delay line 310 are coupled to 32 respectively different input terminals of a phase selector 312. The signal HD, provided by the frequency dividing circuitry 232 is also coupled to the phase selector 312. Circuitry suitable for use as the phase selector 412 is disclosed in U.S. Pat. No. 3,911,368 entitled "Phase Interpolating Apparatus and Method", which is hereby incorporated by reference.

The phase selector 312 has 32 output terminals, one corresponding to each of 32 output terminals of the delay line 310. In operation, the phase selector 312 compares a transition in the signal HS with transitions in each of the 32 phases of the signal CLK provided by the delay line 310 and indicates which phase of the clock signal has a transition which most closely coincides with the transition in the signal HD. The phase alignment circuitry provides a logic one signal on the output terminal which corresponds to this phase. The other 31 output terminals of the phase selector 312 have logic zero output signals.

The 32 output terminals of the phase selector 312 are applied to respectively different input terminals of a line selection encoder 314. The line selection encoder 314 used in this embodiment of the invention is a conventional priority encoder. The output signal provided by the line selection encoder 314 is a five-bit signal indicating the number, in binary form, of the output signal of the phase selector 312 which has a value of logic one.

The output signal of the line selection encoder 314 is applied to the control input port of a multiplexer 316. The multiplexer 316 used in this embodiment of the invention is a conventional 32-to-1 multiplexer having 32 signal input terminals each of which is coupled to a respectively different one of the output terminals of the delay line 310. The control signal provided by the line selection encoder 314 conditions the multiplexer 316 to provide, as its output signal, the phase of the signal CLK which corresponds to the phase that was selected by the circuitry 312. The output signal, CLK', of the multiplexer 316 is the output signal of the phase alignment circuitry 236.

Referring to FIG. 2, the signal CLK' is applied to frequency dividing circuitry 242 which produces a signal CLK'' having a frequency that is one-half of the frequency of the signal CLK (i.e. 910 $f_H$). The frequency divider 242 used in this embodiment of the invention is a conventional trigger-type flip-flop. This type of flip-flop changes state between logic-one and logic-zero for each positive-going transition of the signal CLK'. The state of the frequency divider 242 is set at the start of each horizontal line by a pulse signal derived from the signal HD provided by the frequency divider circuitry 232. To generate the pulse signal, the signal HD is applied to a delay element 238, which compensates for the processing time through the phase alignment circuitry 236 to produce the final horizontal drive signal, $HD_F$. The signal $HD_F$ is applied to an edge detector 240 which produces the pulse signal applied to the frequency divider 242. The pulses used in this embodiment of the invention have a pulse width of approximately 20 ns. This pulse signal is applied to a preset input terminal of the frequency divider 242. The horizontal drive signal $HD_F$ controls the horizontal deflection circuitry (not shown) of the television receiver partially shown in FIG. 2.

The signal CLK'', provided by the frequency divider 242 is synchronized to the final horizontal sync signal $HD_F$ so that the first pulse of the signal CLK'' following a pulse of the signal $HD_F$ has a predetermined polarity and occurs within one nano-second of a predetermined time with respect to the final horizontal sync signal $HD_F$. The signal CLK'' is applied to a delay element 244 which compensates for the processing delay imparted to the video signals Y, I and Q by the sync separator 212, chrominance signal demodulator 214 and/or delay element 215. The signal provided by the delay element 244 is the sampling clock signal, $CLK_S$.

FIGS. 4A through 4I are waveform diagrams which illustrate the operation of the clock generation system. FIG. 4A shows the timing of a positive going transition of the horizontal synchronizing signal component of the composite video signal provided by the source 210. The corresponding transition of the separated horizontal synchronizing signal, HSYNC, is shown in FIG. 4B. The time delay between the transition in FIG. 4A and that in FIG. 4B represents the signal processing delay through the sync separator circuitry 224. FIG. 4C is a waveform diagram of the component of the separated luminance signal Y' which corresponds to the positive going transition of the horizontal synchronizing signal. The time between the transitions in FIG. 4A and FIG. 4C represents the signal processing delay through the luminance/chrominance separation circuitry 212 and the compensating delay element 215.

The signal CLK provided by the VCO 230 is shown in FIG. 4D. The frequency of this signal may jitter about a nominal frequency as described above in reference to FIG. 1. The signal HD, generated by the frequency divider 232 from the signal CLK, is shown in FIG. 4E. The signal HD is advanced with respect to the signal HSYNC by an amount of time $\tau L$, representing the signal processing delay provided by the sync separator 224, and the phase alignment circuitry 236. The phase aligned clock signal CLK', provided by the circuitry 236 is shown in FIG. 4F. The delay between the positive going transition of the signal HD and the closest positive going transition of the signal CLK' is the signal processing delay through the multiplexer 316 of the phase circuitry 236. The final horizontal drive signal $HD_F$, and the clock signals CLK'' and $CLK_S$ are shown in FIGS. 4G, 4H and 4I, respectively.

The positive-going transition in the signal $HD_F$ occurs at substantially the same time as the transition in the horizontal line synchronizing signal component of the composite video signal, shown in FIG. 4A, due to the selection of the delay value $\tau L$. In this embodiment of the invention, $\tau L$ is the sum of the processing delay through the sync separator 224 and phase alignment circuitry 236. By advancing the timing of the signal HD by $\tau L$ with respect to the signal HSYNC, the delay element 234 compensates for the processing delay through these circuit elements to produce a horizontal drive signal, $HD_F$, and a clock signal CLK'' that are closely aligned in phase with the horizontal line synchronizing signal components of the video signals provided by the source 210. The clock signal CLK'' is substantially free of jitter with respect to the signal $HD_F$ due to the phase alignment circuitry 236. The sampling clock signal $CLK_S$, shown in FIG. 4I is delayed by an amount of time $\tau C$ which compensates for the processing delay through the luminance/chrominance separator circuitry 212, and the chrominance demodulator 214 or the delay element 215. The digital samples produced by the ADC's 216, 218 and 220 in response to the clock signal $CLK_S$ have consistent timing relative to the signal $HD_F$ from line to line and from field to field. In addition, since the signal $CLK_S$ is a line-locked clock signal, the number of samples in each line interval and, so, in each field interval of the sampled video signals is consistent from field to field.

What is claimed is:
1. A clock signal generation system comprising:
a source of reference signal having a frequency that is substantially equal to a predetermined frequency;
a phase locked loop, coupled to said source of reference signal for generating first and second oscillatory signals that are locked in phase to said reference signal, wherein said first oscillatory signal has a nominal frequency of N times said predetermined frequency, N being an integer greater than 1, and is subject to undesirable variations in frequency between predetermined minimum and maximum values, and said second oscillatory signal has a frequency substantially equal to said predetermined frequency; and signal phase alignment means, coupled to said phase locked loop for compensating for the undesirable variations in frequency of said first oscillatory signal, including:

means, responsive to said first oscillatory signal for developing M further oscillatory signals representing M respectively different phases of said first oscillatory signal where M is an integer greater than 1; and means responsive to said second oscillatory signal for continually selecting from among said M further oscillatory signals, an output oscillatory signal having a transition which is approximately coincident with a transition in said second oscillatory signal.

2. The clock signal generation system set forth in claim 1 wherein said phase locked loop includes:

a variable oscillator, for generating said first oscillatory signal having a nominal frequency substantially equal to N times said predetermined frequency, said variable oscillator being responsive to a control signal for changing the frequency of said first oscillatory signal;

signal frequency dividing means, coupled to said variable oscillator for dividing said first oscillatory signal, in frequency, by a factor of N to develop said second oscillatory signal;

signal delaying means, coupled to said signal frequency dividing means for delaying said second oscillatory signal by a predetermined amount of time;

phase comparison means, coupled to said signal delaying means, for generating a phase difference signal proportional to the difference in phase between said reference signal and said delayed second oscillatory signal; and means, responsive to said phase difference signal for generating said control signal which tends to condition said variable oscillator to change the frequency of said first oscillatory signal in a sense to reduce the magnitude of said phase difference signal.

3. A digital television signal processing system comprising:

a source of television signal including a horizontal line synchronizing signal component having a frequency substantially equal to a predetermined frequency;

television signal processing means coupled to said source including means for separating the horizontal line synchronizing signal from said television signal;

a phase locked loop, coupled to said television signal processing means for generating first and second oscillatory signals that are locked in phase to said separated horizontal line synchronizing signal, wherein, said first oscillatory signal has a nominal frequency of N times said predetermined frequency, N being an integer greater than 1, and is subject to undesirable variations in frequency between predetermined minimum and maximum values, and said second oscillatory signal has a frequency substantially equal to said predetermined frequency; and signal phase alignment means, coupled to said phase locked loop for developing a clock signal from said first oscillatory signal, said clock signal being compensated for the undesirable variations in the frequency of said first oscillatory signal, said signal phase alignment means comprising:

means, responsive to said first oscillatory signal for developing M further oscillatory signals representing M respectively different phases of said first oscillatory signal, where M is an integer greater than 1; and means, responsive to said second oscillatory signal for continually selecting from among said M further oscillatory signals, a signal to be provided as said clock signal, wherein a transition in said selected further oscillatory signal is substantially coincident with a transition in said second oscillatory signal.

4. The television signal processing system set forth in claim 3 wherein said phase locked loop includes:

a variable oscillator, for generating said first oscillatory signal having a nominal frequency substantially equal to N times said predetermined frequency, said variable oscillator being responsive to a control signal for changing the frequency of said first oscillatory signal;

signal frequency dividing means, coupled to said variable oscillator for dividing said first oscillatory signal, in frequency, by a factor of N to develop said second oscillatory signal;

signal delaying means, coupled to said signal frequency dividing means for delaying said second oscillatory signal by a predetermined amount of time;

phase comparison means, coupled to said signal delaying means, for generating a phase difference signal that is proportional to the difference in phase between said reference signal and said delayed second oscillatory signal; and means, responsive to said phase difference signal for generating said control signal which tends to condition said variable oscillator to change the frequency of the first oscillatory signal in a sense to reduce the magnitude of said phase difference signal.

5. The television signal processing system set forth in claim 4 wherein:

the television signal provided by said source includes a luminance signal component and a chrominance signal component which includes first and second color difference signal components;

said television signal processing means further includes means for separating the luminance signal component and the first and second color difference signal components from said television signal; and analog-to-digital conversion means responsive to said output clock signal for generating first, second and third sampled data digital signals representing, respectively, said separated luminance signal and said separated first and second color difference signals.

6. A clock signal generation system comprising:

a source of first reference signal having a frequency that is substantially equal to a predetermined frequency;

a source of second reference signal having a frequency that is substantially equal to said predetermined frequency;

a phase locked loop, coupled to said source of reference signal for generating an oscillatory signal that is locked in phase to said first reference signal, wherein said oscillatory signal has a nominal frequency of N times said predetermined frequency, N being an integer greater than 1, and is subject to undesirable variations in frequency between predetermined minimum and maximum values; and signal phase alignment means, coupled to said phase locked loop for compensating for the undesirable variations in frequency of said oscillatory signal, including:

means, responsive to said oscillatory sigal for developing M further oscillatory signals representing M respectively different phases of said oscillatory signal where M is an integer greater than 1; and means responsive to said second reference signal for continually selecting from among said M further oscillatory signals, an output oscillatory signal having a transition which is approximately coincident with a transition in said second reference signal.

7. A digital television signal processing system comprising:

a source of television signal including a horizontal line synchronizing signal component having a frequency substantially equal to a predetermined frequency;

television signal processing means coupled to said source including means for separating the horizontal line synchronizing signal from said television signal;

a phase locked loop, coupled to said television signal processing means for generating an oscillatory signal that is locked in phase to said separated horizontal line synchronizing signal and has a nominal frequency of N times said predetermined frequency, N being an integer greater than 1, said oscillatory signal being subject to undesirable variations in frequency between predetermined minimum and maximum values;

a source of horizontal drive signal; and signal phase alignment means, coupled to said phase locked loop for developing a clock signal from said oscillatory signal, said clock signal being compensated for the undesirable variations in the frequency of said oscillatory signal, said signal phase alignment means comprising:

means, responsive to said oscillatory signal for developing M further oscillatory signals representing M respectively different phases of said oscillatory signal, where M is an integer greater than 1; and means, responsive to said horizontal drive signal for continually selecting from among said M further oscillatory signals, a signal to be provided as said clock signal, wherein a transition in said selected further oscillatory signal is substantially coincident with a transition in said horizontal drive signal.

* * * * *